(12) United States Patent
Kawamura

(10) Patent No.: US 7,227,226 B2
(45) Date of Patent: Jun. 5, 2007

(54) SEMICONDUCTOR DEVICE WITH BURIED-OXIDE FILM

(75) Inventor: Keiko Kawamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 83 days.

(21) Appl. No.: 11/091,419

(22) Filed: Mar. 29, 2005

(65) Prior Publication Data

US 2005/0253187 A1    Nov. 17, 2005

(30) Foreign Application Priority Data

Mar. 31, 2004   (JP)  .............................. 2004-107544

(51) Int. Cl.
*H01L 29/41*   (2006.01)
(52) U.S. Cl. ............... 257/332; 257/135; 257/E27.091; 438/155
(58) Field of Classification Search .............. 257/135, 257/E27.091, 332; 438/155
See application file for complete search history.

(56) References Cited

U.S. PATENT DOCUMENTS 6,121,661 A * 9/2000 Assaderaghi et al. ....... 257/355
6,307,224 B1   10/2001 Shirai
6,352,882 B1    3/2002 Assaderaghi et al.
6,459,142 B1 * 10/2002 Tihanyi ....................... 257/621
6,740,930 B2 *  5/2004 Mattei et al. ................ 257/329

* cited by examiner

*Primary Examiner*—Howard Weiss
*Assistant Examiner*—John Ingham
(74) *Attorney, Agent, or Firm*—Oblon, Spivak, McClelland, Maier & Neustadt, P.C.

(57) ABSTRACT

The present invention is a semiconductor device which includes: a semiconductor substrate; a BOX film disposed on top of the semiconductor substrate; an active layer disposed on top of the BOX film; a base region disposed proximate to a surface of the active layer; a first main electrode region disposed within the base region; a second main electrode region formed from the surface of the active layer to a surface of the BOX film or protruding through the BOX film, and the second main electrode region being spaced from the base region; a gate insulator film disposed on the surface of the base region; a gate electrode disposed on top of the gate insulator film; a first main electrode connected to the first main electrode region; a second main electrode connected to the second main electrode region; and a ground electrode connected to the semiconductor substrate on an opposite side surface from a surface having the BOX film on the semiconductor substrate.

14 Claims, 7 Drawing Sheets

SEMICONDUCTOR DEVICE WITH BURIED-OXIDE FILM

CROSS REFERRENCE TO RELATED APPLICATIONS AND INCORPORATION BY REFERENCE

This application is based upon and claims the benefit of priority from prior Japanese Patent Applications P2004-107544 filed on Mar. 31, 2004; the entire contents of which are incorporated by reference herein.

BACKGROUND OF THE INVENTION

1. Field of the Invention

The present invention relates to semiconductor devices, and particularly to semiconductor devices encompassing buried oxide structures.

2. Description of the Related Art 700V class lateral power MOSFETs are often built into intelligent power devices as output elements, for example. Horizontal or lateral DMOSFETs generally have less input capacitance and feedback capacitance than vertical DMOSFETS, and thus are beneficial in high-speed operations. However, with a lateral DMOSFET compared with a vertical MOSFET of the same drain breakdown voltage level, ON resistance is equal or greater, and switching power loss increases. Because of this, in order to expand applications to high power switching power supplies that further reduce electrical power consumption or increase output current, it is essential to reduce the ON resistance without reducing the drain breakdown voltage of a power MOSFET.

Up until presently, SC (Single conduction) structures, DC (double conduction) structures, and TC (triple conduction) structures have been proposed for use as a lateral MOSFET Structure put forth above.

A 700 V class lateral MOSFET, having a DC structure produced with the objective of reducing ON resistance, is already being implemented at present. Using an ion implantation apparatus with high acceleration energy, the DC structure having a dual pass conduction channel is formed within an n type drift region, realizing low ON resistance.

Also a lateral MOSFET, that has a triple pass conduction channel formed within an n type drift region, and having a TC structure exhibiting even less ON resistance than a DC structure, is being implemented with equal or greater breakdown voltage (See, "Improvements in drain breakdown voltage of 700V lateral MOSFETS according to TC (Triple Conduction) structure" Author: Mr. Yasuhiro Takehana et. al., DENKI GAKKAI DENSHI DEBAISU/HANDOUTAI DENRYOKU HENKAN GOUDOU KENKYUKAI, EDD-03-48, SPC-03-115, 2003/09, P. 21–26).

Earlier Silicon On Insulator (SOI) structure lateral MOSFETs include, as shown in FIG. 1, a support substrate 2 made from semiconductor substrate, a buried oxide film (BOX film) 3, an active layer (n$^-$ layer) 4, a base region 5, a back gate region 6, a source region 7, a drain region 8, a source electrode 9, a drain electrode 10, a gate electrode 11, and a gate insulator film 12.

In a MOSFET implementing SOI, because the size of the depletion layer is governed by the thickness of the active layer and the thickness of the buried oxide film, it is essential to provide a thick active layer 4 in order to achieve a high breakdown voltage. If the active layer 4 is thick, formation of the element isolation region and wafer processing itself become difficult. And in a case in which a super junction, which enables high breakdown voltage and low ON resistance, is formed in a SOI wafer, if the electric potential of the substrate is established as ground or floating, it is impossible to make use of a high breakdown voltage enabled by the super junction while concentrating an electric field at the drain electrode or source electrode. Further, compared to a vertical MOSFET that flows a current vertically, because it is difficult to increase a pn junction, effectiveness of reduction of ON resistance ($R_{on}$) tends to decrease.

SUMMARY OF THE INVENTION

An aspect of the present invention inheres in a semiconductor device which includes: a semiconductor substrate; a BOX film disposed on top of the semiconductor substrate; an active layer disposed on top of the BOX film; a base region disposed proximate to a surface of the active layer; a first main electrode region disposed within the base region; a second main electrode region formed from the surface of the active layer to a surface of the BOX film or protruding through the BOX film, and the second main electrode region being spaced from the base region; a gate insulator film disposed on the surface of the base region; a gate electrode disposed on top of the gate insulator film; a first main electrode connected to the first main electrode region; a second main electrode connected to the second main electrode region; and a ground electrode connected to the semiconductor substrate on an opposite side surface from a surface having the BOX film on the semiconductor substrate.

Another aspect of the present invention inheres in a semiconductor device which includes: a semiconductor substrate; a BOX film disposed on top of the semiconductor substrate; an active layer, disposed on top of the BOX film, including a first and a second pillar regions forming a pn junction in between, and the first pillar region is located in the surface side of the active layer and the pn junction has a substantially parallel interface to the surface of the active layer; a gate electrode formed vertically in relation to the surface of the active layer; a gate insulator film disposed on an interface between the active layer and the gate electrode; a base region disposed proximate to the surface of the first pillar region and adjacent to the gate electrode; a first main electrode region disposed within the base region; a second main electrode region formed from the surface of the active layer to the surface of the BOX film or protruding through the BOX film, and the second main electrode region being spaced from the base region; a first main electrode connected to the first main electrode region; a second main electrode connected to the second main electrode region; and a ground electrode connected to the semiconductor substrate on an opposite side surface from a surface having the BOX film on the semiconductor substrate.

Another aspect of the present invention inheres in a semiconductor device which includes: a semiconductor substrate; a BOX film disposed on top of the semiconductor substrate; an active layer, disposed on top of the BOX film, including a first, a second and a third pillar regions forming pn junctions in between, and the pn junctions have a substantially parallel interface to a contact surface of the third pillar region on the BOX film; a gate electrode formed vertically in relation to the surface of the active layer; agate insulator film disposed on an interface between the active layer and the gate electrode; a base region disposed proximate to the surface of the first pillar region and adjacent to the gate electrode; a first main electrode region disposed within the base region; a second main electrode region formed from the surface of the active layer at least to the second pillar region, and the second main electrode region being spaced from the base region; a first main electrode, connected to the first main electrode region, which includes a portion that spans from the surface of the active layer extending through the first and second pillar regions to within the third pillar region in the proximity of the BOX film; a second main electrode connected to the second main electrode region; and a ground electrode connected to the semiconductor substrate on an opposite side surface from a surface having the BOX film on the semiconductor substrate.

DETAILED DESCRIPTION OF THE INVENTION

Figure 1:
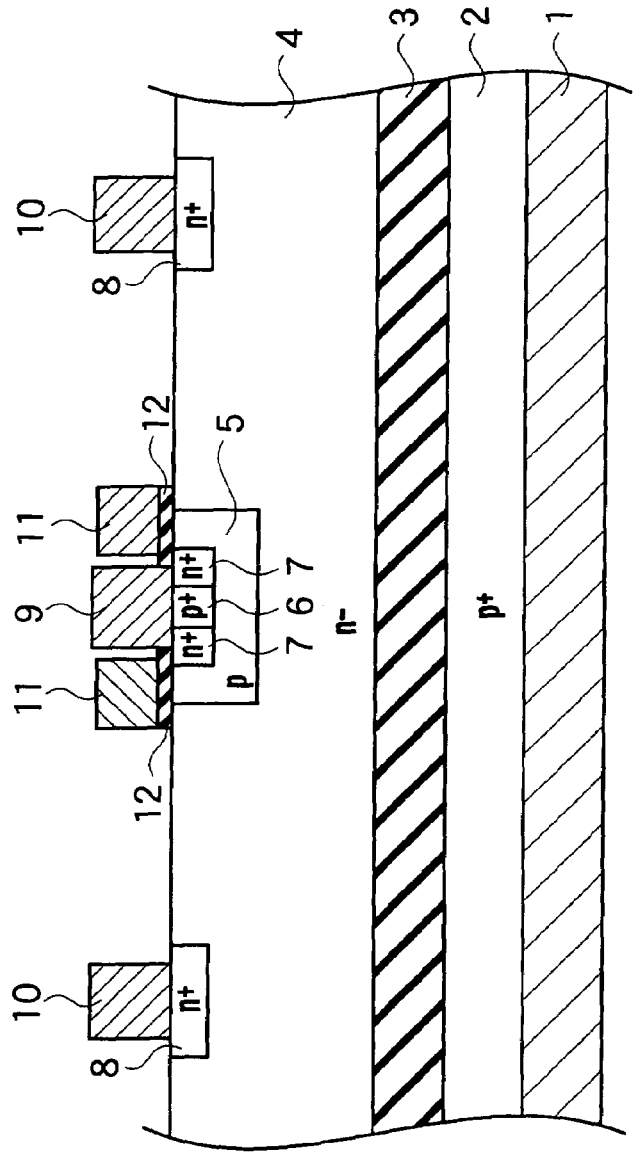
FIG. 1 is a representational cross section view of the element structure of earlier semiconductor devices.

Various embodiments of the present invention will be described with reference to the accompanying drawings. It is to be noted that the same or similar reference numerals are applied to the same or similar parts and elements throughout the drawings and the description of the same or similar parts and elements will be simplified or omitted.

As is typical in the representation of cross section drawings of devices, it should be noted that the various drawings are not drawn to scale, and particularly that cross sections of devices are adaptively depicted for easy comprehension of the drawings.

In the following descriptions, numerous specific details such as specific device parts, etc., are set forth to facilitate a thorough understanding of the present invention. However, it will be obvious to one skilled in the art that the present invention may be practiced without reference to such specific details. In other instances, well-known device structures included in the drawings have been depicted in cross sectional form so as not to obscure the present invention in unnecessary detail.

Next, the first through fourth embodiments will be described with reference to the drawings In the below mentioned figs, identical or analogous symbols are assigned to represent identical or analogous members. However, it should be understood that the drawings are meant to be merely representational, as relationships between depicted thickness and planar dimensions, as well as thickness proportions of the layers, will differ from the relationships between depicted thickness and planar dimensions, and thickness proportions of the real thing. Therefore, specific thickness or dimensions should be judged by what is gathered from the below description. And it is also a matter of course that within the drawings there occur parts dimensional or proportional relationships differing from one another.

The first through fourth embodiments put forth below are examples shown to express the technical concepts of the present invention in detail, and these technical concepts of the present invention do in no way limit the materials, form, structure, or arrangements of the components. It is possible to add various modifications to the technical concepts of the present invention within the scope of the claims of the patent.

[First Embodiment]

Figure 3:
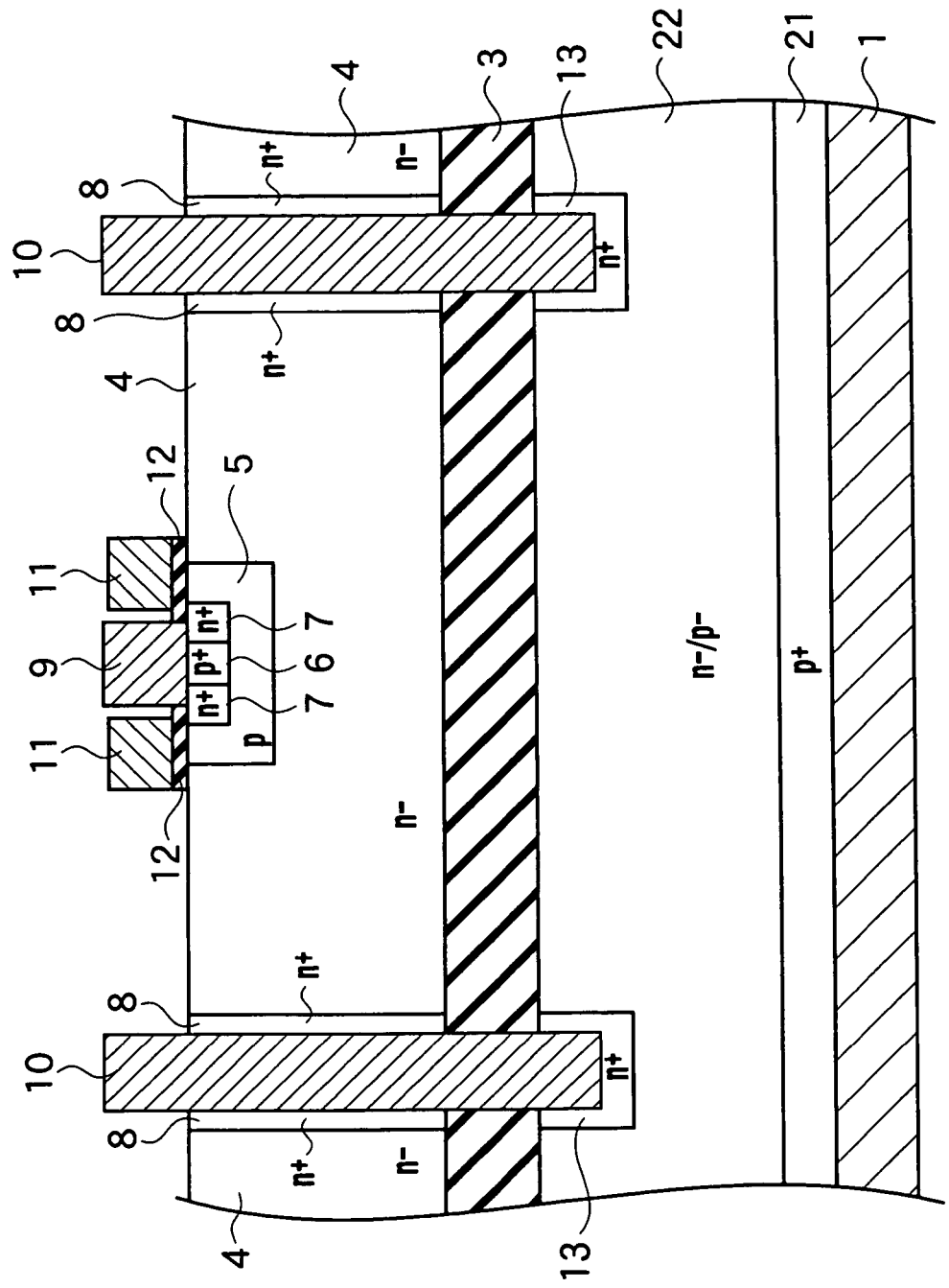
FIG. 3 is a representational cross section view of the element structure of the semiconductor device according to the first embodiment of the present invention.

As shown in FIG. 3, the representational element cross section structure showing a unit cell part of a semiconductor device according to the first embodiment of the present invention includes a buried oxide film (BOX film) 3, an active layer ($n^-$ layer) 4 deposited on top of the BOX film 3, a base region 5 deposited near the surface of the active layer 4, a back gate region 6 formed within in the base region 5, a first main electrode region 7 formed within the base region 5 in a same manner, a second main electrode region 8 formed extending from the surface of the active layer 4 protruding through the BOX film 3, a gate electrode 11 arranged above the base region 5 via a gate insulator film 12, a first main electrode 9 contacting with the first main electrode region 7, a second main electrode 10 contacting with the second main electrode region 8 within the second main electrode region 8, a ground electrode 1, a $p^+$ support substrate 21 and a support substrate 22 of a $p^-$ layer or an $n^-$ layer, and a support substrate side second main electrode 13.

Figure 2:
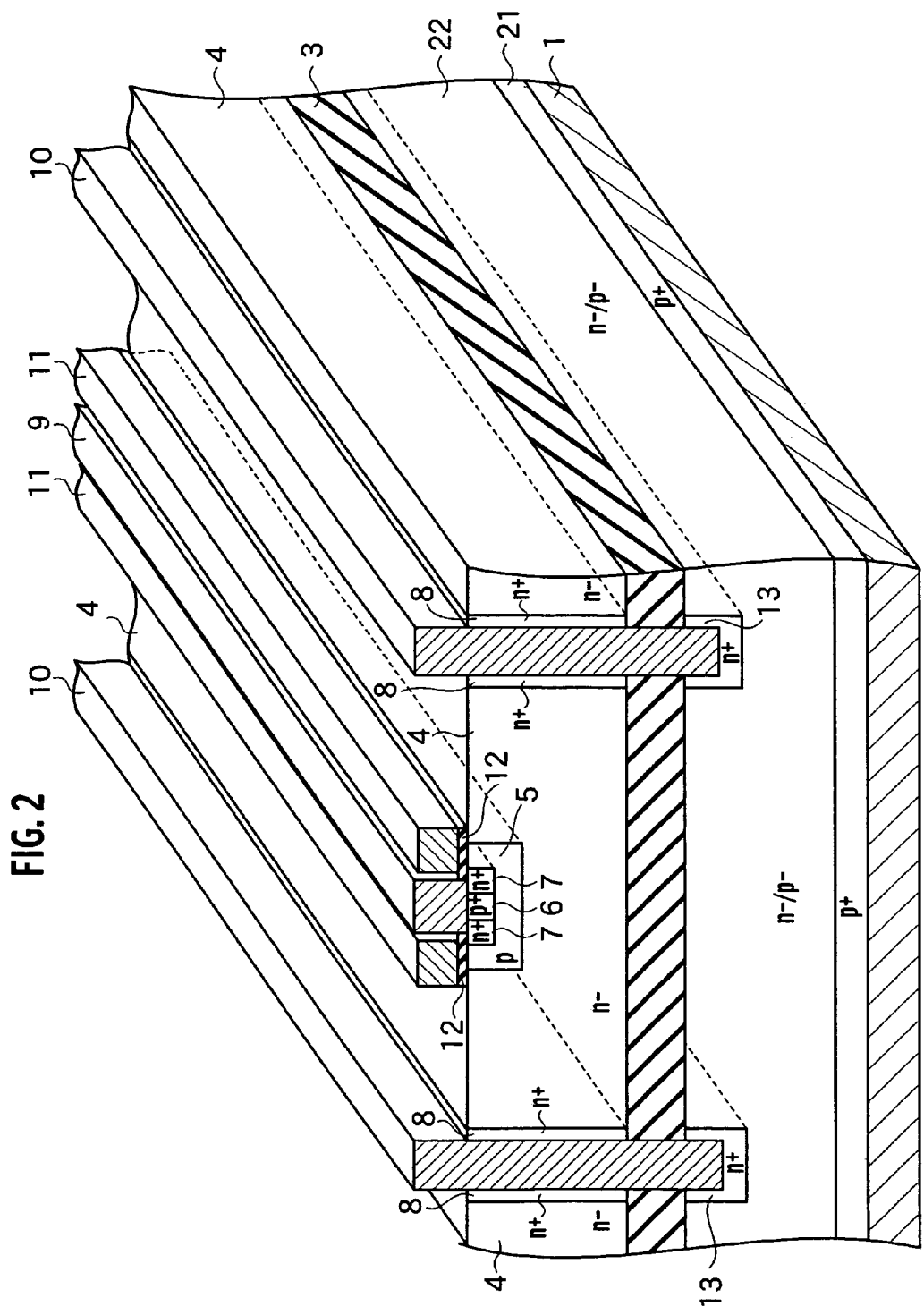
FIG. 2 is a representational birds eye view of a semiconductor device according to a first embodiment of the present invention.

And a representational birds eye view showing a unit cell part of the semiconductor device according to the first embodiment of the present invention is shown in FIG. 2. FIG. 2 shows examples of a first main electrode (a source electrode) 9, a second main electrode (a drain electrode) 10, and the gate electrode 11 formed in a stripe-shaped structure corresponding to the cross sectional view as shown in FIG. 3. It is a matter of course that the semiconductor device according to the first embodiment of the present invention may be formed in an island shape as well, and is not limited to a strip shape shown in FIG. 2. Moreover, a surface layout pattern of the unit cell part of the semiconductor device according to the first embodiment of the present invention is entirely provided for following the second, the third and the fourth embodiment of the present invention in a same manner.

According to arranging a plurality of the unit cell shown in FIG. 3 in a row, it is possible to enable high current operations. According to including the support substrate side second main electrode region 13 underneath the second main electrode region 8 formed protruding through the BOX film 3, it is possible to accurately form a depletion layer on the side of the support substrate 22, while making it possible to soften electric field concentration in the part of the second main electrode 10 contacting with the support substrate 22.

In the semiconductor device according to the first embodiment of the present invention, the "first main electrode region" represents a source region, the "second main electrode region" represents a drain region, the "first main electrode" represents a source electrode, and the "second main electrode" represents a drain electrode.

As can be clearly observed from FIG. 3, the drain electrode 10 protrudes through the BOX film 3 reaching to within the support substrate 22. The support substrate 22 includes a support substrate 21 formed as a p⁺ layer on the underside. The support substrate 21 serves as ground for the support substrate 22. And above the support substrate 21, the support substrate 22, which is made of an n⁻ layer or a p⁻ layer, is formed contacting with the active layer 4 through the medium of the BOX film 3, as viewed from the support substrate side in FIG. 3. The conduction type, impurity concentration, and thickness of the support substrate 22 are matters that are decided during design according to the breakdown voltage requirements.

According to relatively increasing impurity concentrations of the active layer 4 and relatively increasing carrier concentrations existing within the active layer 4, low ON resistance can be realized. Put more plainly, structural characteristics of the semiconductor device according to the first embodiment of the present invention shown in FIG. 3 inheres in forming a region involved with carrier conduction separate from a region given for the high breakdown voltage.

The active layer 4 involved in carrier conduction is limited to a narrow region surrounded by the BOX film 3 and the second main electrode region 8, and the region given the breakdown voltage is set on the support substrate 22 in between the ground electrode 1 and the drain electrode 10 formed protruding through the BOX film 3.

On the semiconductor device according to the first embodiment of the present invention, the value of the breakdown voltage of the drain side is roughly decided by the thickness of the depletion layer extending from the support substrate side drain region 13 to the support substrate 22. However, in a case in which drain voltage is applied to the drain electrode 10, voltage is also induced at a pn junction near the source electrode 9. Consequently, because substrate voltage in the proximity of the underside of the source electrode 9 increases more than 0 V, actual breakdown voltage is decided by a balance between the source and drain.

According to the semiconductor device of the first embodiment of the present invention, it is possible to soften electric field concentration occurring near the drain region 8 or the source region 7 while realizing low ON resistance at high breakdown voltage.

[Second Embodiment]

Figure 4:
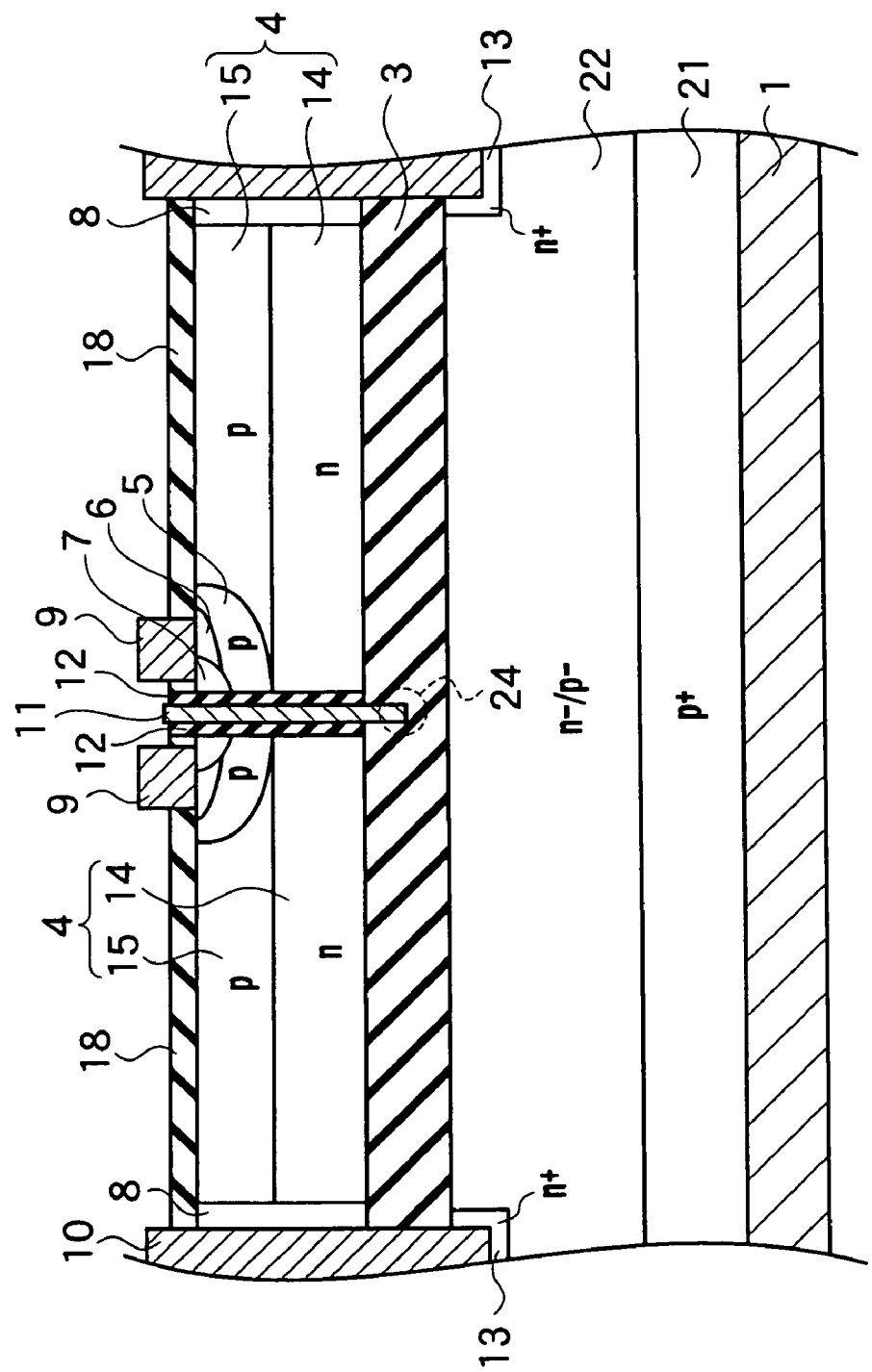
FIG. 4 is a representational cross section view of the element structure of a semiconductor device according to a second embodiment of the present invention.

As illustrated in FIG. 4, a representational cross section elemental structure showing a unit cell part of a semiconductor device according to a second embodiment of the present invention includes a ground electrode 1, a p⁺ support substrate 21, a support substrate 22, a BOX film 3, an n pillar region 14 and a p pillar region 15, a base region 5, a back gate region 6, a source region 7, a drain region 8, a source electrode 9, a drain electrode 10, a gate electrode 11, a gate insulator film 12, a support substrate side drain region 13, and an insulator film 18. The p⁺ support substrate 21 contacts with the ground 1, the support substrate 22 is made of an n⁻ layer or a p⁻ layer disposed on top of the p⁺ support substrate 21, the BOX film 3 is disposed on the support substrate 22, the n pillar region 14 and p pillar region 15 are disposed on top of the BOX film 3 forming the active layer 4, the base region 5 is disposed within the p pillar region 15, the back gate region 6 is disposed within the base region 5, the source region 7 is likewise disposed within the base region 5, the drain region 8 is formed protruding through the BOX film 3 from the surface of the active layer 4, the source electrode 9 contacts the back gate region 6 and the source region 7, the drain electrode 10 contacts the drain region 8 in a section within the drain region 8, the gate electrode 11 is formed vertically in relation to the surface of the active layer 4, the gate insulator film 12 is formed at a boundary between the active layer 4 and the gate electrode 11 in a manner such as to extend from the surface of the active layer 4 to the BOX film 3, the insulator film 18 is disposed on the surface of the active layer 4 in between the source and drain.

An aspect of the semiconductor device according to the second embodiment of the present invention inheres in a super junction structure including the p pillar region 15 and the n pillar region 14 within the active layer 4 in between the source and drain. The super junction structure, which includes a pn junction having a parallel junction interface to a surface of the active layer 4, is formed in between the source and drain of a MOSFET.

In a case of a semiconductor device according to the second embodiment of the present invention, the super junction structure has a pn junction including the p pillar region 15 and the n pillar region 14, as can be clearly seen in FIG. 4. Such a super junction structure spreads uniformly within the active layer 4, disposed in repetition. FIG. 4, showing the unit cell part of the semiconductor device according to the second embodiment of the present invention, the drain region 8 connected to the drain electrode 10 is formed sandwiched by the super junction structure, which includes the p pillar region 15 and the n pillar region 14, in between adjacent unit cells.

Further, a structural aspect of the semiconductor device of the second embodiment of the present invention inheres in forming the gate electrode 11 vertically in respect to the surface of the active layer 4 so that the gate electrode 11 reaches from the surface of the active layer 4 to within the BOX film 3, and in the same manner forming the gate insulator film 12, on the boundary interface between the active layer 4 and the gate electrode 11, from the surface of the active layer 4 reaching to the BOX film 3. In extending the gate electrode 11 to within the BOX film 3, a curved portion 24 of the gate electrode 11 is preserved at the BOX film 3. Because of the curved portion 24 of the gate electrode 11 protected by the BOX film 3, the breakdown voltage improves by approximately 100V, for example. Although the curved portion 24 of the gate is depicted as rectangular in form in FIG. 4, it has subtly structured corner portions that are curved, and according to preserving it at the BOX film 3, a structure that mitigates the electric field is formed.

On the semiconductor device according to the second embodiment of the present invention, by adopting a super junction structure including the p pillar region 15 and the n pillar region 14, it is possible to realize a lower ON resistance while maintaining the high breakdown voltage, when compared to the semiconductor devices according to the first embodiment of the present invention.

In a case in which the drain electrode 10 terminates above the BOX film 3, in respect to breakdown voltage of 169.3V for example, if structured so that the drain electrode 10 penetrates through the support substrate 22, the breakdown voltage improves drastically to 582.5V, for example. And in the same manner as in the first embodiment, the impurity concentration and thickness of the n⁻ layer or the p⁻ layer of the support substrate 22 are matters of designed factors determined by the required breakdown voltage.

In an n channel MOSFET, it is possible to lower ON resistance according to designing the n pillar region 14, which is a current path, with a high impurity concentration or with an amount of layer thickness of the n pillar region 14.

And in the same way, in a p channel MOSFET, it is possible to lower ON resistance according to designing the p pillar region 14 for the p channel MOSFET, which is a current path, with a high impurity concentration or with an amount of layer thickness of the p pillar region 14 for the p channel MOSFET, because the n pillar region 14 for the n channel MOSFET becomes a p pillar region for the p channel MOSFET. Further, because the depletion layer in between the source and drain spans along the super junction structure and extends horizontally from the source region 7 to the drain region 8, also because the curved portion 24 of the gate is preserved at the BOX film 3 according to vertically forming the gate electrode 11, and extending the gate electrode 11 to within the BOX film 3, the gate electrode 11 is easily preserved.

Because of the gate structure having the vertically formed gate electrode 11, concentration of electric fields are easily generated in the bottom portion or the curved portion 24 of the gate electrode 11. However, the curved portion 24 of the gate electrode 11 is preserved at the BOX film 3. Thus, it is possible to further mitigate the concentrated electrical field at the curved portion 24 of the gate electrode 11, at the place where the curved portion 24 reaches near the support substrate 22. Therefore, it is possible to maintain the breakdown voltage.

According to the semiconductor device of the second embodiment of the present invention, it is possible to soften electric field concentration occurring near the bottom portion or the curved portion 24 of the gate electrode 11 while realizing low ON resistance at high breakdown voltage.

Modified Example of the Second Embodiment

Figure 5:
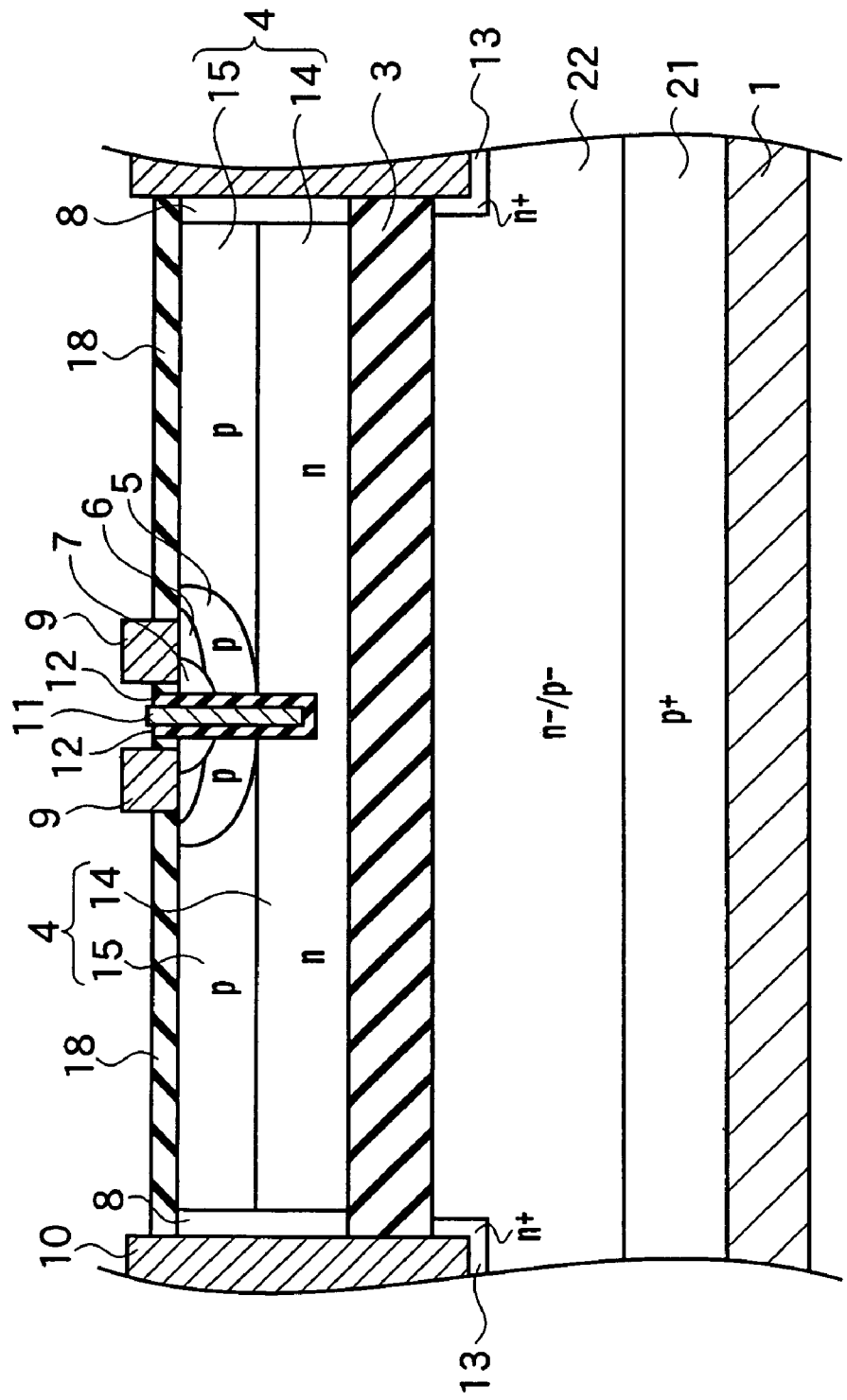
FIG. 5 is a representational cross section view of the element structure of the semiconductor device according to a modification of the second embodiment of the present invention.

As illustrated in FIG. 5, a representational cross section elemental structure showing a unit cell part of a semiconductor device according to a modified example of the second embodiment of the present invention includes a ground electrode 1, a p$^+$ support substrate 21, a support substrate 22, a BOX film 3, an n pillar region 14 and a p pillar region 15, a base region 5, a back gate region 6, a source region 7, a drain region 8, a source electrode 9, a drain electrode 10, a gate electrode 11, a gate insulator film 12, a support substrate side drain region 13, and an insulator film 18. The p$^+$ support substrate 21 contacts with the ground 1, the support substrate 22 is made of an n$^-$ layer or a p$^-$ layer disposed on top of the p$^+$ support substrate 21, the BOX film 3 is disposed on the support substrate 22, the n pillar region 14 and p pillar region 15 are disposed on top of the BOX film 3 forming the active layer 4, the base region 5 is disposed within the p pillar region 15, the back gate region 6 is disposed within the base region 5, the source region 7 is likewise disposed within the base region 5, the drain region 8 is formed protruding through the BOX film 3 from the surface of the active layer 4, the source electrode 9 contacts the back gate region 6 and the source region 7, the drain electrode 10 contacts the drain region 8 in a section within the drain region 8, the gate electrode 11 is formed vertically in relation to the surface of the active layer 4 reaching to within the n pillar region 14 in the proximity of the BOX film 3, the gate insulator film 12 is formed at a boundary between the active layer 4 and the gate electrode 11 in a manner such as to extend from the surface of the active layer 4 reaching to within the n pillar region 14 in the proximity of the BOX film 3, the insulator film 18 is disposed on the surface of the active layer 4 in between the source and drain.

An aspect of the semiconductor device according to the modified example of the second embodiment of the present invention inheres in a super junction structure including the p pillar region 15 and the n pillar region 14 within the active layer 4 in between the source and drain. The super junction structure, which includes a pn junction having a parallel junction interface to the surface of the active layer 4, is formed in between the source and drain of a MOSFET.

In a case of a semiconductor device according to the modified example of the second embodiment of the present invention, the super junction structure has a pn junction including the p pillar region 15 and the n pillar region 14, as can be clearly seen in FIG. 5. Such a super junction structure spreads uniformly within the active layer 4, disposed in repetition. FIG. 5, showing the unit cell part of the semiconductor device according to the modified example of the second embodiment of the present invention, the drain region 8 connected to the drain electrode 10 is formed sandwiched by the super junction structure, which includes the p pillar region 15 and the n pillar region 14, in between adjacent unit cells.

Further, a structural aspect of the semiconductor device of the modified example of the second embodiment of the present invention inheres in forming the gate electrode 11 vertically in respect to the surface of the active layer 4 so that the gate electrode 11 reaches from the surface of the active layer 4 reaching to within the n pillar region 14 in the proximity of the BOX film 3, and in the same manner forming the gate insulator film 12, on the boundary interface between the active layer 4 and the gate electrode 11, from the surface of the active layer 4 reaching to the n pillar region 14. In extending the gate electrode 11 to within the n pillar region 14, a curved portion 24 of the gate electrode 11 is preserved at the n pillar region 14. Because of the curved portion 24 of the gate electrode 11 protected by the n pillar region 14, the breakdown voltage improves. According to preserving the curved portion 24 of the gate electrode 11 at the n pillar region 14, a structure that mitigates the electric field is formed.

On the semiconductor device according to the modified example of the second embodiment of the present invention, by adopting a super junction structure including the p pillar region 15 and the n pillar region 14, it is possible to realize a lower ON resistance while maintaining the high breakdown voltage, when compared to the semiconductor devices according to the first embodiment of the present invention.

[Third Embodiment]

Figure 6:
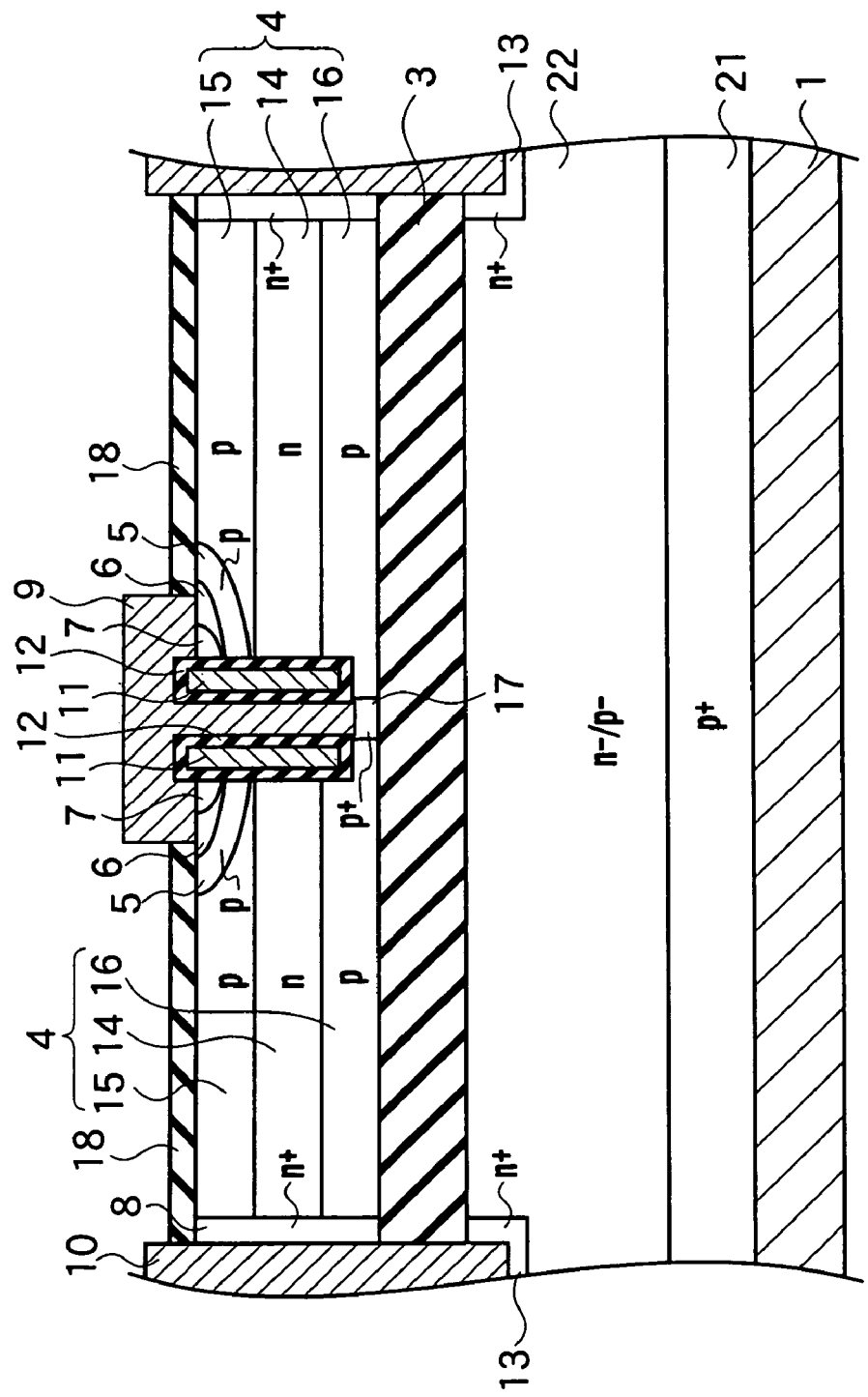
FIG. 6 is a representational cross section view of the element structure of a semiconductor device according to a third embodiment of the present invention.

A representational cross sectional elemental structure showing a unit cell part of a semiconductor device according to the third embodiment of the present invention includes, a ground electrode 1, a p$^+$ support substrate 21, a support substrate 22, a BOX film 3, a p pillar region 16, an n pillar region 14 and a p pillar region 15, a base region 5, a back gate region 6, a source region 7, a drain region 8, a source electrode 9, a p pillar back gate region 17, a drain electrode 10, a gate electrode 11, a gate insulator film 12, a support substrate side drain region 13, and an insulator film 18, as shown in FIG. 6. The p$^+$ support substrate 21 contacts the ground electrode 1. The support substrate 22 is made of an n$^-$ layer or a p$^-$ layer disposed on top of the p$^+$ support substrate 21. The BOX film 3 is disposed on the support substrate 22. The p pillar region 16, n pillar region 14, and p pillar region 15 are disposed on top of the BOX film 3 forming an active layer 4. The base region 5 is disposed within the p pillar region 15. The back gate region 6 is disposed within the base region 5. Similar to the back gate region 6, the source region 7 is disposed within the base region 5. The drain region 8 is formed from the surface of the active layer 4 penetrating through the BOX film 3. The source electrode 9 contacts with the back gate region 6 and the source region 7, and further has a portion that spans from the surface of the active layer 4 reaching to within the p pillar region 16 in the proximity of the BOX film 3. The p pillar back gate region 17 is connected to the source electrode 9 within the p pillar region 16. The drain electrode 10 is connected to the drain region 8 within the drain region 8. The gate electrode 11 is formed vertically, in respect to the surface of the active layer 4, from the surface of the active layer 4 extending to reach within the p pillar region 16 in the proximity of the BOX film 3. The gate insulator film 12 is formed on the boundary between the active layer 4 and the gate electrode 11 from the surface of the active layer 4 extending to within the p pillar region 16 in the proximity of the BOX film 3. The insulator film 18 is disposed on the surface of the active layer 4 in between the source and drain.

The semiconductor device according to the third embodiment of the present invention has a characteristic structure using a super junction in the same manner as in the second embodiment. In order to realize a low ON resistance in semiconductor device according to the third embodiment of the present invention, the p pillar region 16 is further established under the n pillar region 14. Therefore, a thicker n pillar region 14 can be formed in the third embodiment of the present invention, as compared with the semiconductor device structure according to the second embodiment of the present invention. Even lower ON resistance is realized according to designing the n pillar region 14 relatively thicker and with a high impurity concentrations, compared to the structure shown in FIG. 4.

The p pillar region 15 is referred to as a p pillar region for the base, because the base region 5 is formed within the p pillar region 15. The p pillar region 16 is referred to as a dummy pillar region, because the n pillar region 14 is sandwiched between the p pillar region 15 and the p pillar region 16. The n pillar region 14 is referred to as an n pillar region for the drain, because the n pillar region 14 is connected to the drain region 8. By sandwiching the n pillar region 14 with the p pillar region 15 and the p pillar region 16, thickness of the n pillar region 14 is realized to be double as compared with the thickness of the n pillar region 14 of the semiconductor device according to the second embodiment of the present invention, as shown in FIG. 4. Therefore, it is possible to maintain the breakdown voltage while aiming for lower ON resistance.

In regard to the p pillar region 16 on the BOX film 3, the source electrode 9, which has a portion that extends from the surface of the active layer 4 to within the p pillar region 16, is formed and source electric potential is given to the p pillar region 16 at the bottom of the source electrode 9 via through the p pillar back gate region 17, as shown in FIG. 6. The gate electrode 11 is formed vertically in respect to the active layer 4 on both sides of the source electrode 9, from the surface of the active layer 4 extending to within the p pillar region 16 in the proximity of the BOX film 3 in the same manner as the semiconductor device according to the second embodiment of the present invention, as shown in FIG. 4.

With the structure of the semiconductor device according to the third embodiment of the present invention, there are two of the gate electrode 11 present in order to increase the value of the current density flowing from the source regions 7 to the drain regions 8 on the left and right side of the gate electrodes 11, as shown in FIG. 6.

In the same manner as in the first and second embodiments, by forming the drain region 8 so that it spans from the surface of the active layer 4 extending to the support substrate 22 penetrating through the BOX film 3, it is possible to maintain the breakdown voltage. In the same manner as for the semiconductor device according to the first embodiment, the impurity concentration and thickness of the n⁻ layer or p⁻ layer of the support substrate 22 are matters of designed factors determined by the required breakdown voltage. Values of 120 mΩcm2 (Vds=10 v), 90 mΩcm2 (Vds=1V), for example, are obtained as ON resistance $R_{on}$, and ON resistance values above πMOSFETs are achieved, at the semiconductor device according to the third embodiment of the present invention. The value of breakdown voltage of Vdss=583V is also obtained.

[Fourth Embodiment]

Figure 7:
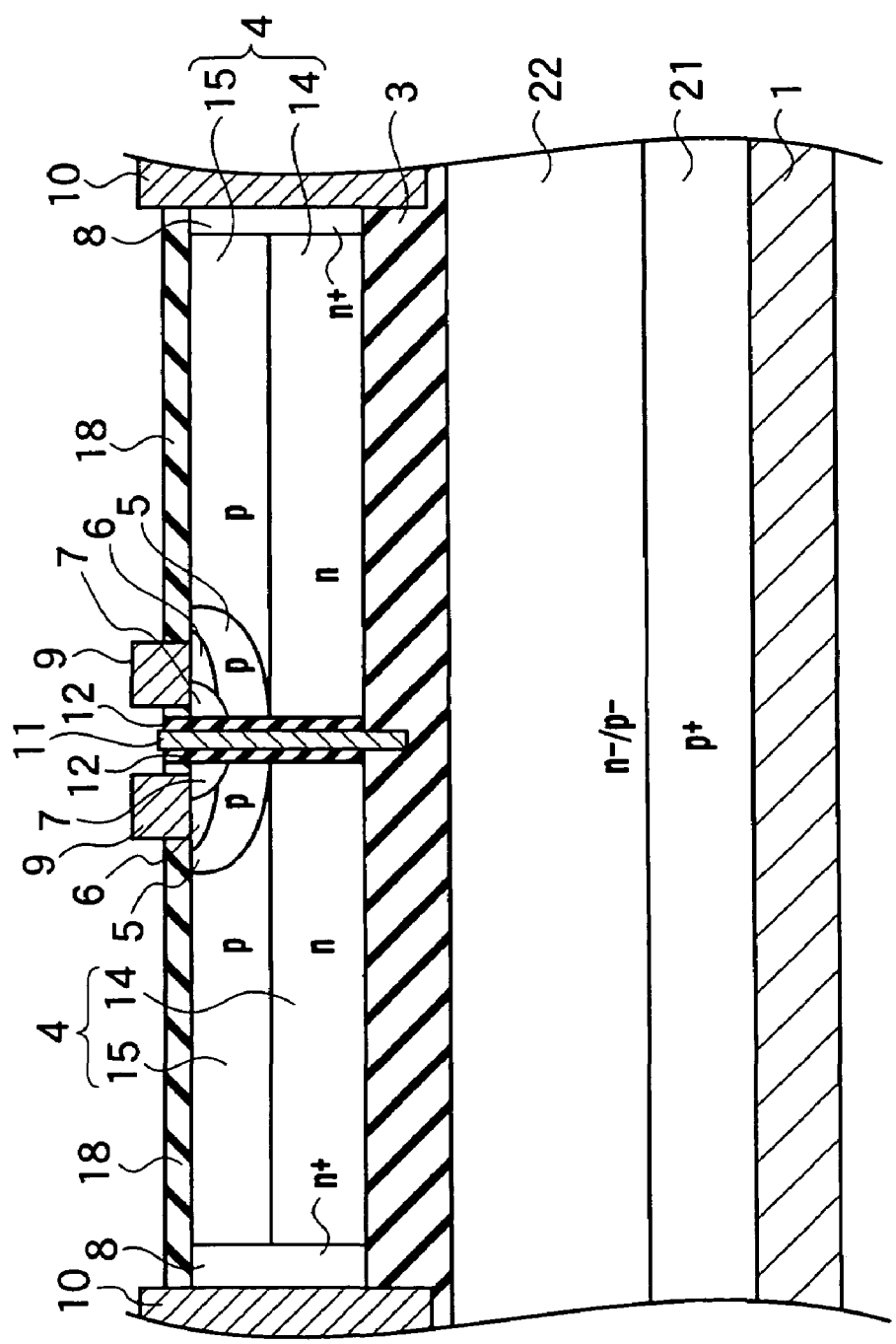
FIG. 7 is a representational cross section view of the element structure of a semiconductor device according to a fourth embodiment of the present invention.

A representational cross sectional elemental structure showing a unit cell part of a semiconductor device according to the fourth embodiment of the present invention includes, a ground electrode 1, a p⁺ support substrate 21, a support substrate 22, a BOX film 3, an n pillar region 14 and a p pillar region 15, a base region 5, a back gate region 6, a source region 7, a drain region 8, a source electrode 9, a drain electrode 10, a gate electrode 11, a gate insulator film 12, and an insulator film 18, as shown in FIG. 7. The p⁺ support substrate 21 is connected to the ground electrode 1. The support substrate 22 is made of an n⁻ layer or a p⁻ layer disposed on top of the p⁺ support substrate 21. The BOX film 3 is disposed on the support substrate 22. The n pillar region 14 and the p pillar region 15 are disposed on top of the BOX film 3 forming an active layer 4. The base region 5 is disposed within the p pillar region 15. The back gate region 6 is disposed within the base region 5. Similar to the back gate region 6, the source region 7 is disposed within the base region 5. The drain region 8 is formed from the surface of the active layer 4 reaching the surface of the BOX film 3 or within the BOX film 3. The source electrode 9 contacts with the back gate region 6 and the source region 7. The drain electrode 10 is connected to the drain region 8 within the drain region 8, and is formed vertically from the surface of the active layer 4 extending to within the BOX film 3. The gate electrode 11 is formed vertically, in respect to the surface of the active layer 4, from the surface of the active layer 4 extending to reach within the BOX film 3. The gate insulator film 12 is formed on the boundary between the active layer 4 and the gate electrode 11 from the surface of the active layer 4 extending to within the BOX film 3. The insulator film 18 is disposed on the surface of the active layer 4 in between the source and drain.

The fourth embodiment of the present invention is roughly identical to the second embodiment of the present invention, however, has an attribute of which the drain electrode 10 terminating within the BOX film 3, as shown in FIG. 7. With the structure of the semiconductor device according to the fourth embodiment of the present invention, although effects of the same extent as of the semiconductor device according to the second embodiment cannot be obtained, the breakdown voltage improves compared to the structure having the drain electrode 10 terminating within the active layer 4.

There is effectiveness in cases in which the impurity concentration of the n pillar region 14 is high, or the thickness of the n pillar region 14 is thick, and the electric field concentrated in the proximity of the source electrode 9 or drain electrode 10 is mitigated, making it possible to aim for improvement in the breakdown voltage. According to requirements of the n pillar region 14, an effect that improves the breakdown voltage of 200 to 300V is achieved, compared with the structure in which the drain electrode 10 terminates within the active layer 4. Also, the structure of the semiconductor device of the fourth embodiment of the present invention shown in FIG. 7 is easier to fabricate compared to the structure of the second embodiment shown in FIG. 4.

[Other Embodiments]

As described above, the present invention is described according to the first through the fifth embodiment; however, it should not be perceived that descriptions forming part of this disclosure and the drawings are intended to limit the spirit and scope of the present invention. Various alternative embodiments, working examples, and operational techniques will become apparent from this disclosure for those skilled in the art.

Particularly, the gate structure is not meant to be limited to a MOS structure, and may be implemented by a MIS structure, Schottky gate structure, hetero-junction structure or a pn junction structure.

Acceptable implementation of the gate structure may also be by a complex-gate structure of MIS gate and pn junction gate structures. It is also acceptable to implement the base layer by a Ge doped SiGe structure. As for device structure, a device such as an insulated gate bipolar transistor (IGBT), an injection enhancement gate transistor (IEGT) a bipolar MOS complex device, or a compound semiconductor device, such as a high electron mobility transistor (HEMT) are acceptable for use. Also, in the second through fourth embodiments of the present invention, although mention of a super junction structure made of a two or three layered structure is disclosed, the super junction structure is not limited to this mention, and may be implemented by a multi layered structure of more than three layers.

In this manner, it is a matter of course that the present invention also includes many other embodiments not mentioned herein. Therefore the technical scope of the present invention should only be deduced from the scope of the claims of the patent and the above description.

In this manner, the present invention naturally includes various embodiments not described herein. Accordingly, the technical scope of the present invention is determined only by specified features of the invention according to appended claims that can be regarded appropriate from the above-mentioned descriptions. Moreover, the structure having the drain electrode 10 terminating within the BOX film 3, as described in the fourth embodiment of the present invention, can be applied for the first and the third embodiment of the present invention in a same manner.

Various modifications will become possible for those skilled in the art after receiving the teachings of the present disclosure without departing from the scope thereof.

What is claimed is:

1. A semiconductor device comprising:
a semiconductor substrate;
a BOX film disposed on top of the semiconductor substrate;
an active layer, disposed on top of the BOX film, comprising first, second, and third regions forming pn junctions in between that are substantially parallel to the surface of the BOX film;
a gate electrode formed vertically in relation to the surface of the active layer;
a gate insulator film disposed on an interface between the active layer and the gate electrode;
a base region disposed proximate to the surface of the first region and adjacent to the gate electrode;
a first main electrode region disposed within the base region;
a second main electrode region formed from the surface of the active layer to the surface of the BOX film or protruding through the BOX film, and the second main electrode region being spaced from the base region;
a first main electrode connected to the first main electrode region;
a second main electrode connected to the second main electrode region; and
a ground electrode connected to the semiconductor substrate on an opposite side surface from a surface having the BOX film on the semiconductor substrate,
wherein the gate electrode is formed from the surface of the active layer to within the BOX film, the first main electrode region spans from the surface of the active layer to within the third region and the second main electrode region is formed from the surface of the active layer to the second region.

2. The semiconductor device of claim 1 further comprising:
a back gate region disposed within the base region and connected to the first main electrode region via through the first main electrode.

3. The semiconductor device of claim 1, wherein the gate electrode is formed from the surface of the active layer to within the second region.

4. The semiconductor device of claim 1, wherein the second main electrode is formed from the surface of the second main electrode region to within the BOX film.

5. The semiconductor device of claim 1, wherein the second main electrode is formed from the surface of the second main electrode region protruding through the BOX film.

6. The semiconductor device of claim 1, wherein the first main electrode, the second main electrode, and the gate electrode are formed in a stripe-shaped structure.

7. A semiconductor device comprising:
a semiconductor substrate;
a BOX film disposed on top of the semiconductor substrate;
an active layer, disposed on top of the BOX film, comprising first, second, and third regions forming pn junctions in between that are substantially parallel to the surface of the BOX film;
a gate electrode formed vertically in relation to the surface of the active layer;
a gate insulator film disposed on an interface between the active layer and the gate electrode;
a base region disposed proximate to the surface of the first region and adjacent to the gate electrode;
a first main electrode region disposed within the base region;
a second main electrode region formed from the surface of the active layer at least to the second region, and the second main electrode region being spaced from the base region;
a first main electrode, connected to the first main electrode region, which includes a portion that spans from the surface of the active layer extending through the first and second regions to within the third region in the proximity of the BOX film;
a second main electrode connected to the second main electrode region; and
a ground electrode connected to the semiconductor substrate on an opposite side surface from a surface having the BOX film on the semiconductor substrate.

8. The semiconductor device of claim 7 further comprising:
a back gate region disposed within the base region and connected to the first main electrode region via through the first main electrode.

9. The semiconductor device of claim 7 further comprising:
a back gate region disposed within the third region and connected to the first main electrode.

10. The semiconductor device of claim 7, wherein the gate electrode is formed from the surface of the active layer to within the pillar region.

11. The semiconductor device of claim 7, wherein the second main electrode region is formed from the surface of the active layer to the surface of the BOX film or protruding through the BOX film.

12. The semiconductor device of claim 11, wherein the second main electrode is formed from the surface of the second main electrode region to within the BOX film.

13. The semiconductor device of claim 11, wherein the second main electrode is formed from the surface of the second main electrode region protruding through the BOX film.

14. The semiconductor device of claim 7, wherein the first main electrode, the second main electrode, and the gate electrode are formed in a stripe-shaped structure.

* * * * *